US012598872B2

(12) United States Patent
Kanaya et al.

(10) Patent No.: US 12,598,872 B2
(45) Date of Patent: Apr. 7, 2026

(54) DISPLAY PANEL, METHOD OF MANUFACTURING THE SAME, AND SUBSTRATE

(71) Applicant: Magnolia White Corporation, Tokyo (JP)

(72) Inventors: Yasuhiro Kanaya, Tokyo (JP); Masanobu Ikeda, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 11 days.

(21) Appl. No.: 18/739,654

(22) Filed: Jun. 11, 2024

(65) Prior Publication Data

US 2024/0334743 A1 Oct. 3, 2024

Related U.S. Application Data

(60) Division of application No. 17/330,607, filed on May 26, 2021, now Pat. No. 12,041,821, which is a (Continued)

(30) Foreign Application Priority Data

Nov. 27, 2018 (JP) ................................. 2018-221074

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1213* (2023.02); *H10K 59/131* (2023.02); *H10K 59/80516* (2023.02); *H10K 59/1201* (2023.02)

(58) Field of Classification Search
CPC ............. H10K 59/1213; H10K 59/131; H10K 59/1201; H10K 71/00; H10K 59/14; H10K 59/80516
See application file for complete search history.

(56) References Cited

U.S. PATENT DOCUMENTS

| | | | |
|---|---|---|---|
| 2015/0187272 A1 | 7/2015 | Kimura et al. | |
| 2018/0069126 A1 | 3/2018 | Sasaki et al. | |
| 2018/0211582 A1* | 7/2018 | Sakariya ................... | G09G 3/32 |

FOREIGN PATENT DOCUMENTS

| | | |
|---|---|---|
| CN | 107750377 A | 3/2018 |
| CN | 108682366 A | 10/2018 |

(Continued)

OTHER PUBLICATIONS

Office Action issued on Jun. 16, 2022, in connection with corresponding Chinese Application No. 201980062616.2 (18 pp., including machine-generated English translation).

*Primary Examiner* — Timor Karimy
(74) *Attorney, Agent, or Firm* — Maier & Maier, PLLC

(57) ABSTRACT

According to one embodiment, a display panel includes a substrate, a first insulating layer, and a plurality of pixels including sub-pixels of a plurality of colors, respectively. Each of the sub-pixels includes a drive transistor, a pixel electrode supplied with a signal having a current value controlled from the drive transistor, and a light emitting element mounted on the pixel electrode. Each of the pixels includes a mounting electrode located to be spaced apart from the pixel electrode. The mounting electrode is in an electrically floating state in a first pixel of the plurality of pixels.

8 Claims, 9 Drawing Sheets

Related U.S. Application Data continuation of application No. PCT/JP2019/044440, filed on Nov. 12, 2019.

(51) Int. Cl.
*H10K 59/121* (2023.01)
*H10K 59/131* (2023.01)
*H10K 59/80* (2023.01)

(56) References Cited

FOREIGN PATENT DOCUMENTS

| | | | |
|---|---|---|---|
| JP | 2009151098 | A | 7/2009 |
| JP | 2018010309 | A | 1/2018 |
| JP | 2018041752 | A | 3/2018 |
| WO | 2014149864 | A1 | 9/2014 |

* cited by examiner

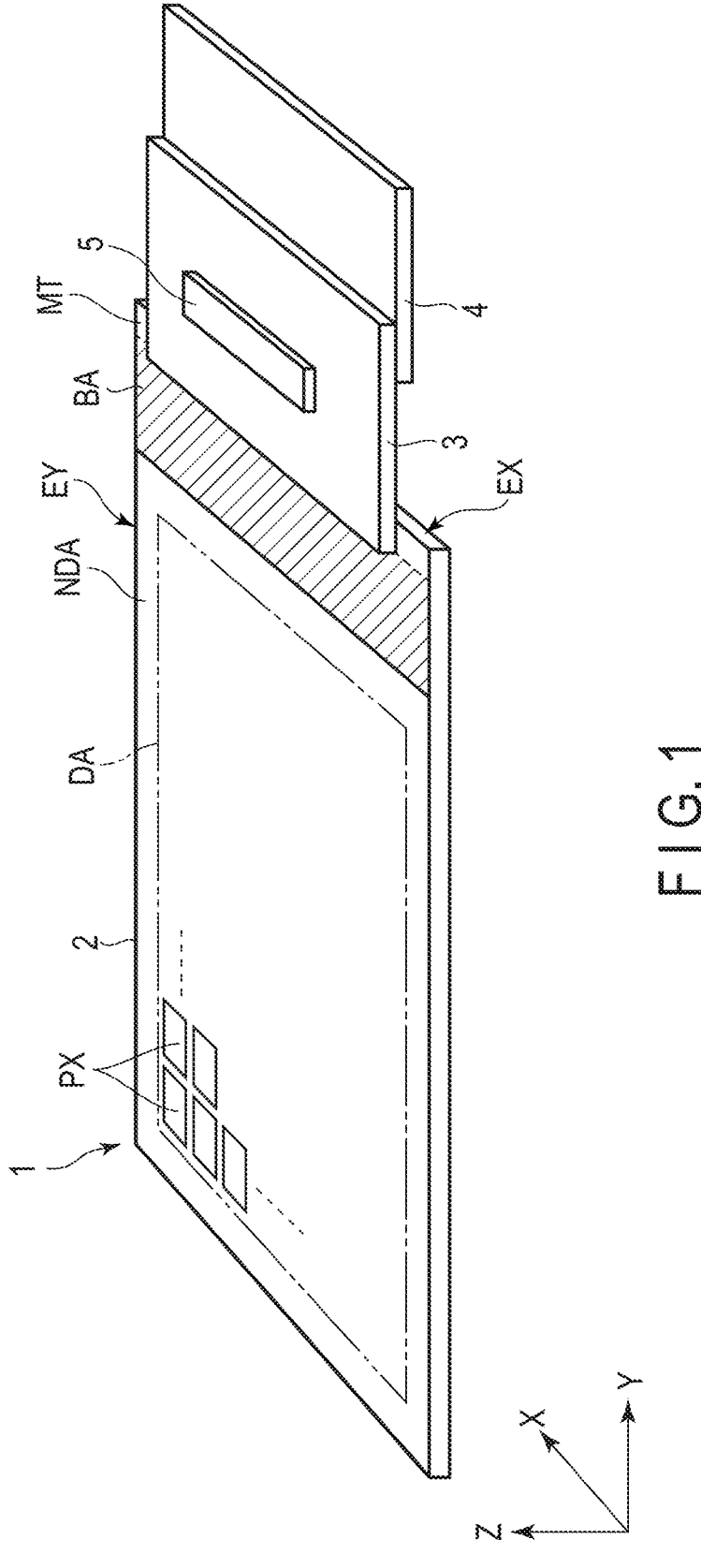
F I G. 1

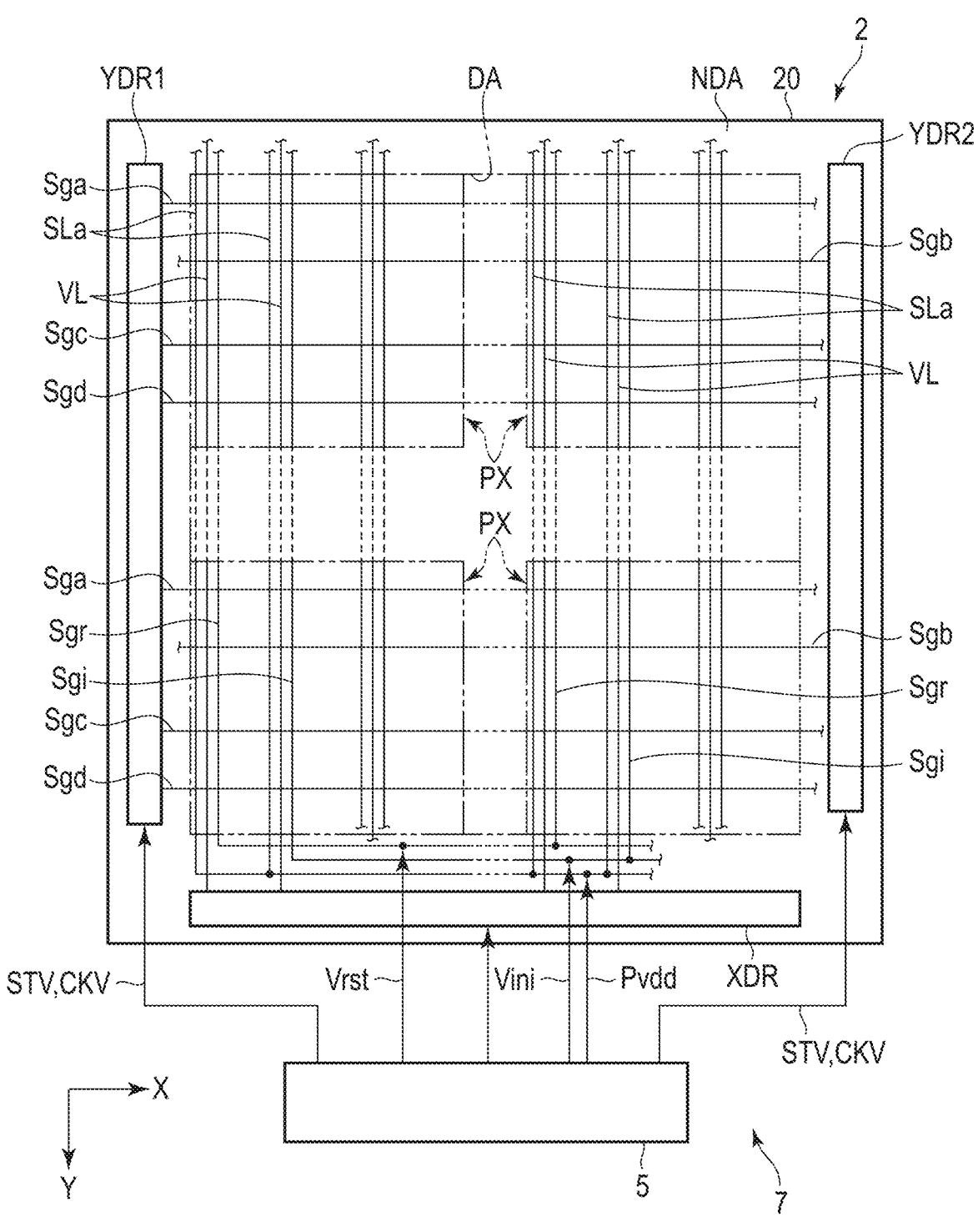
F I G. 2

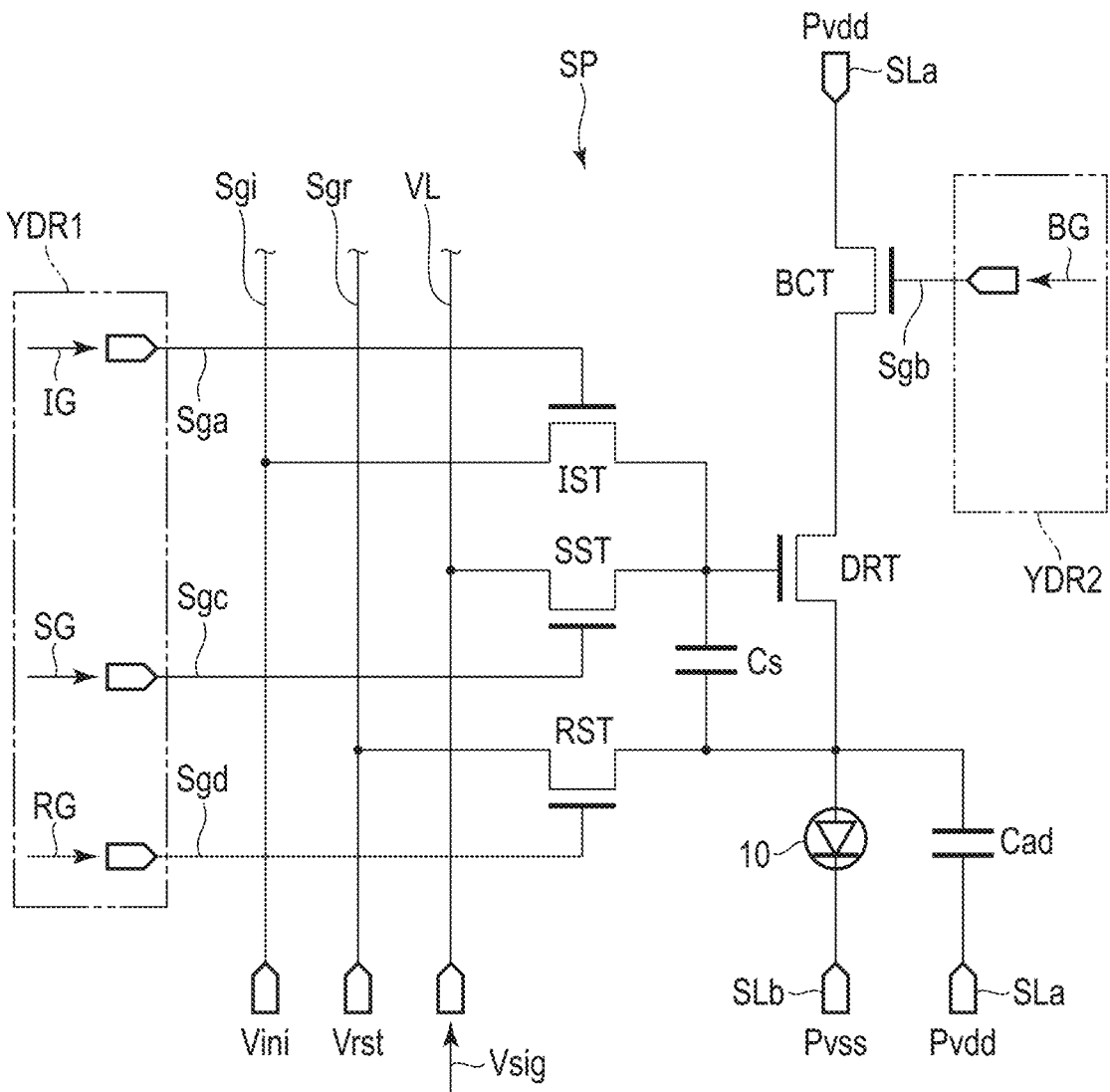
F I G. 3

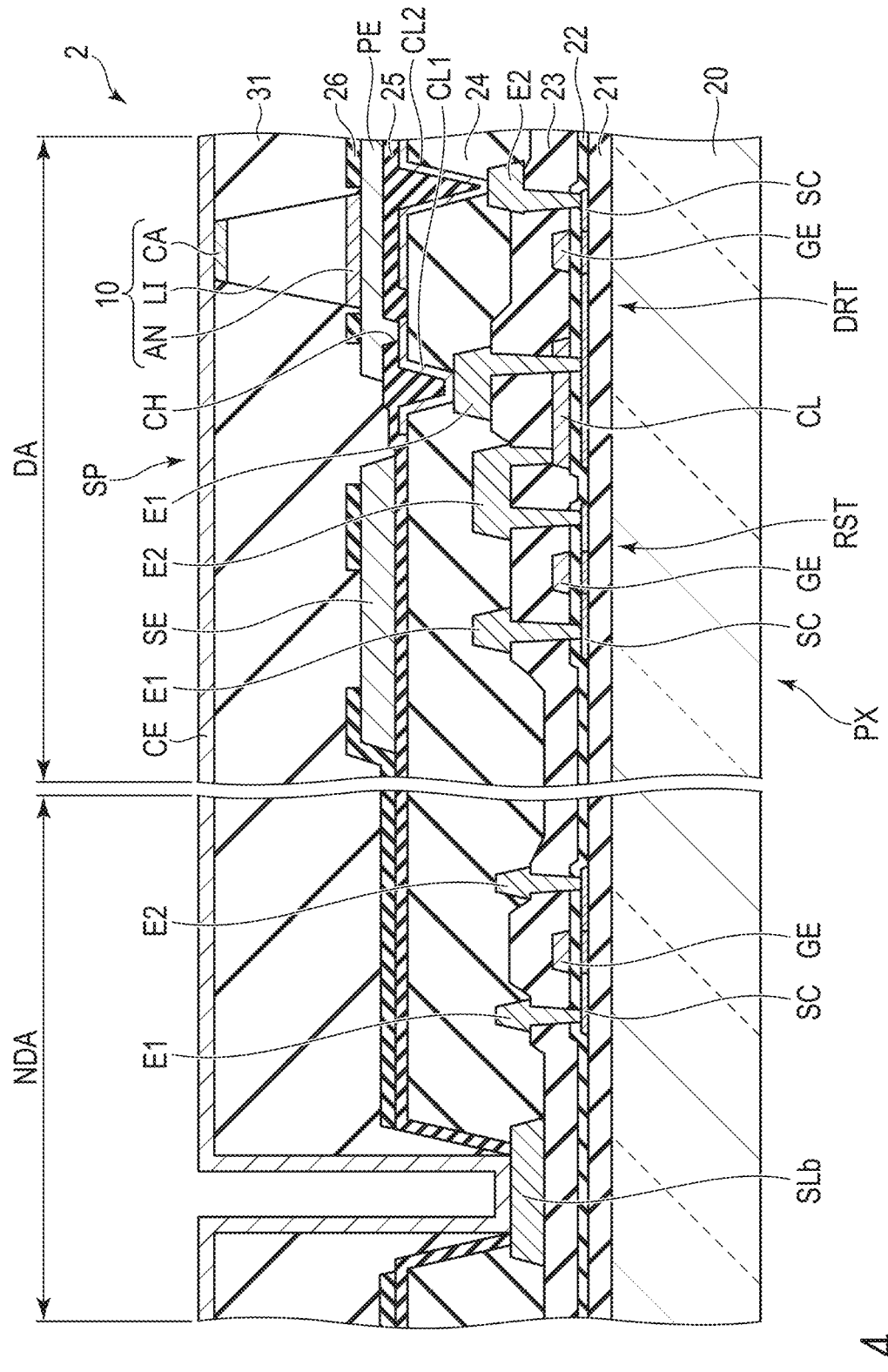
F I G. 4

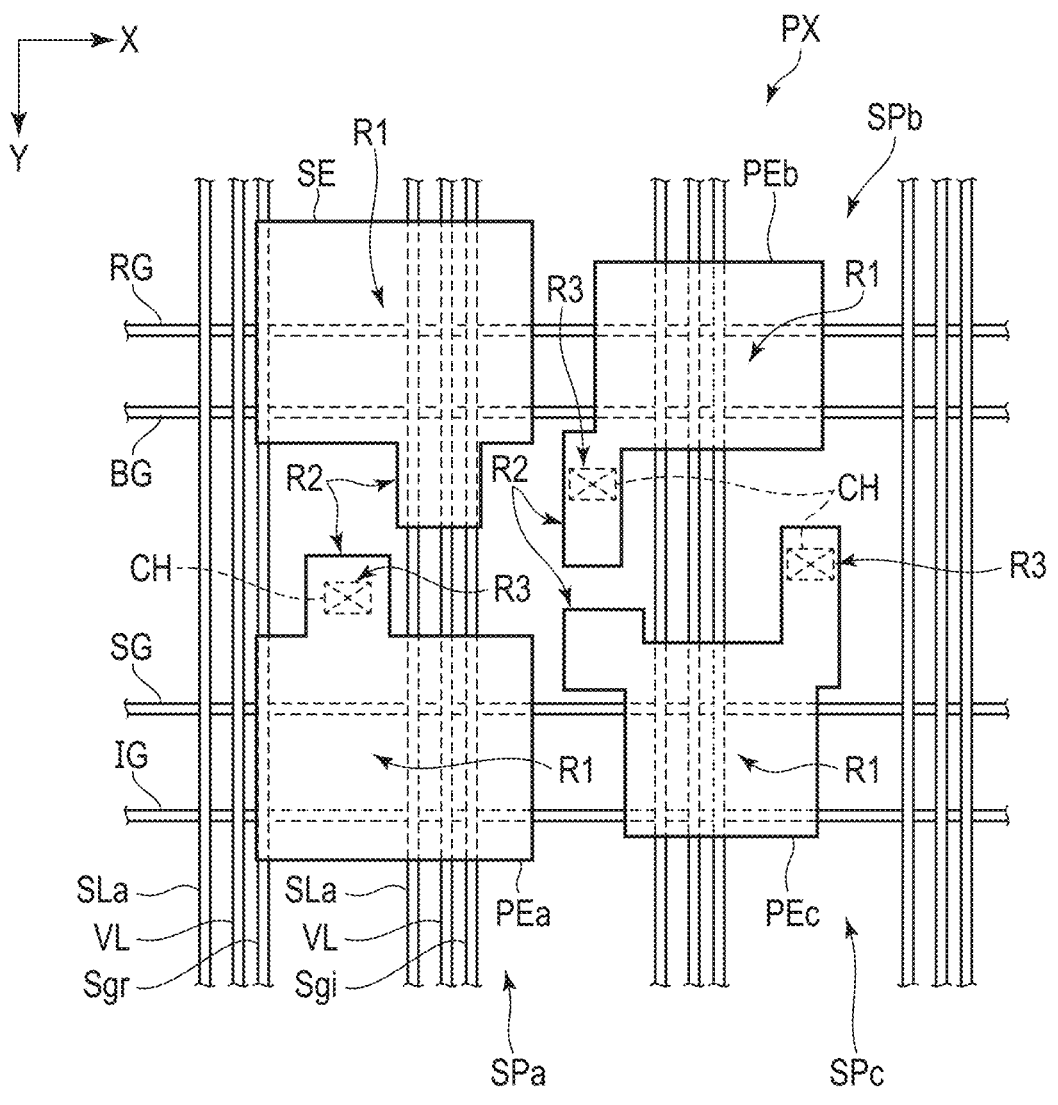
F I G. 5

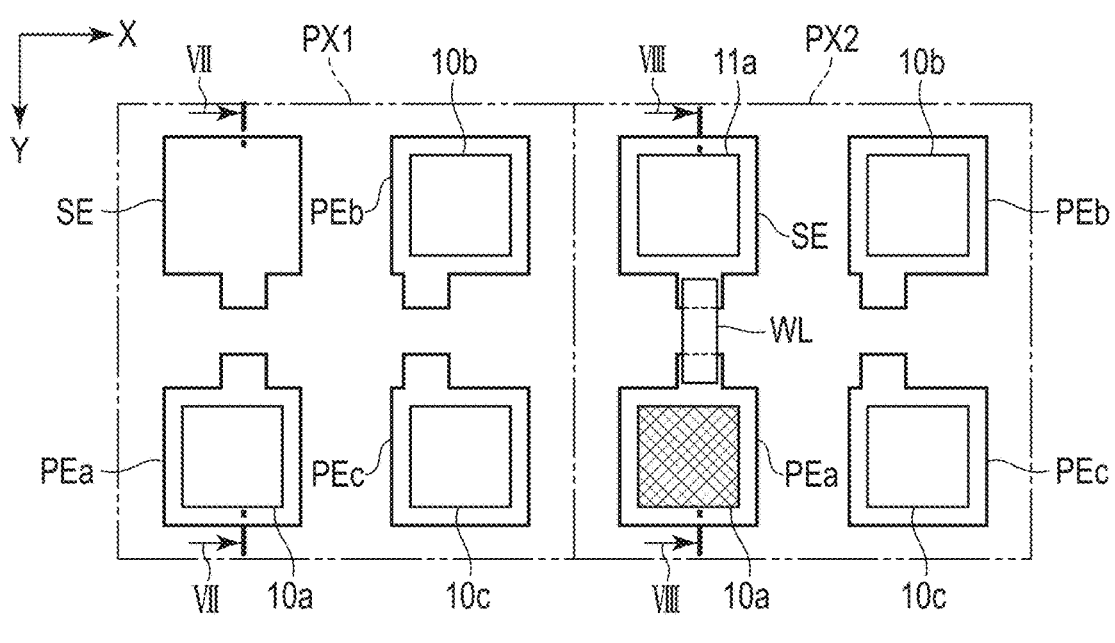
F I G. 6
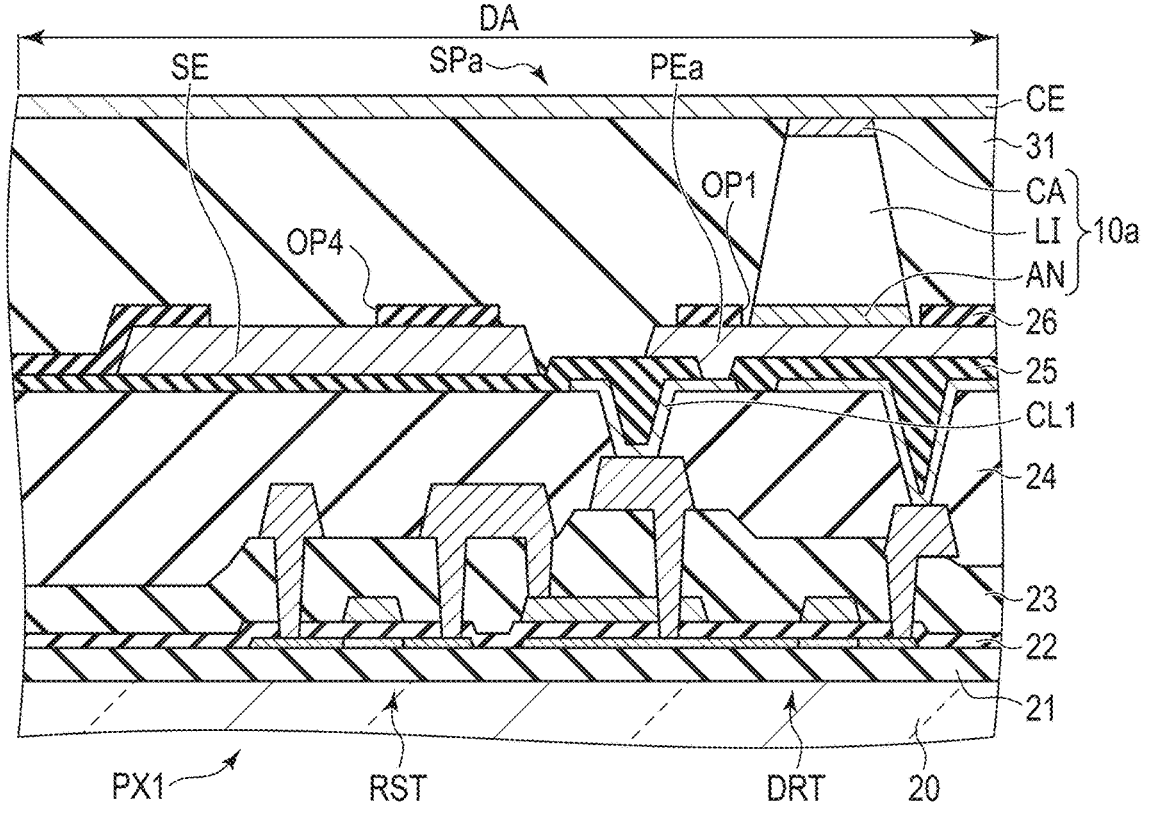
F I G. 7

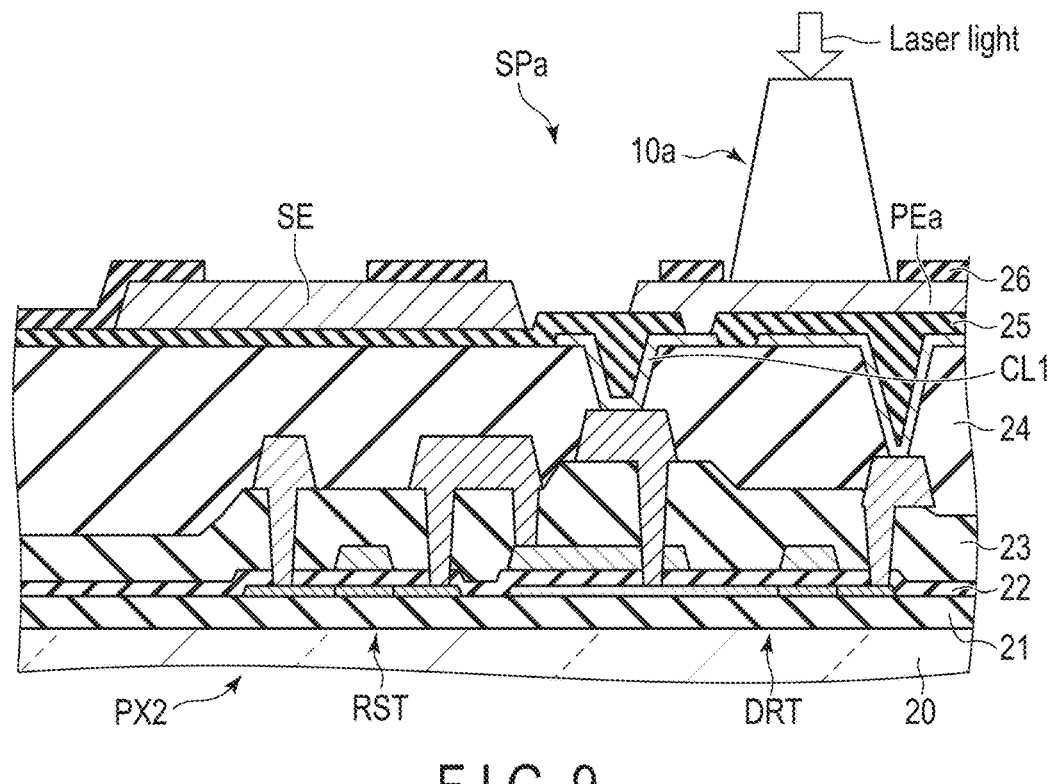
F I G. 9
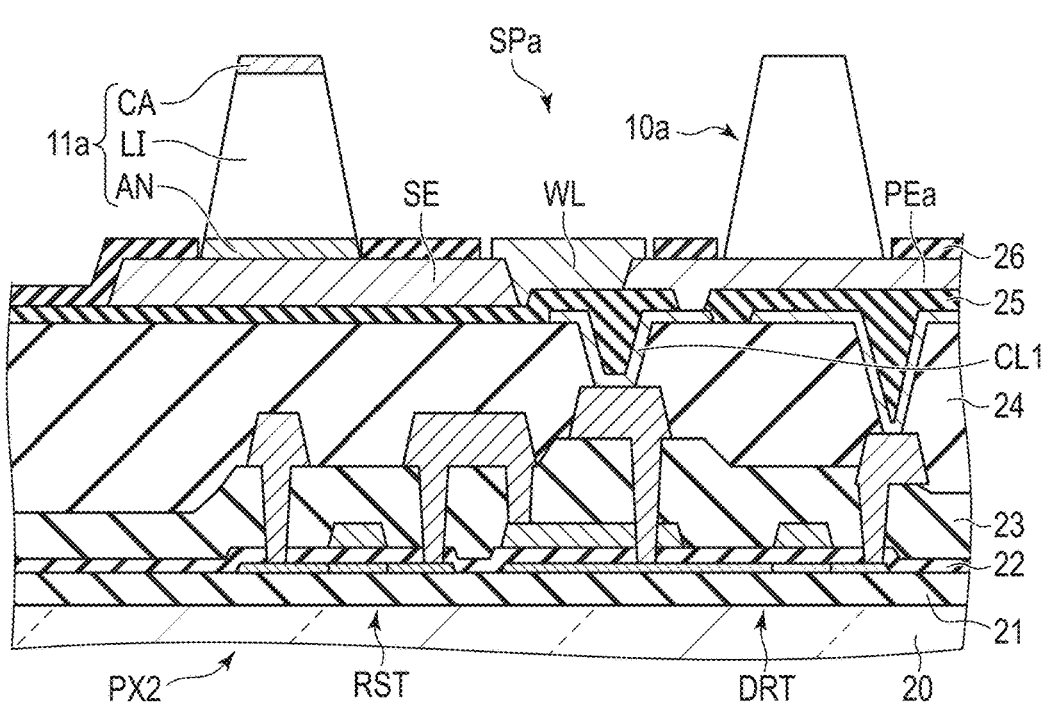
F I G. 10

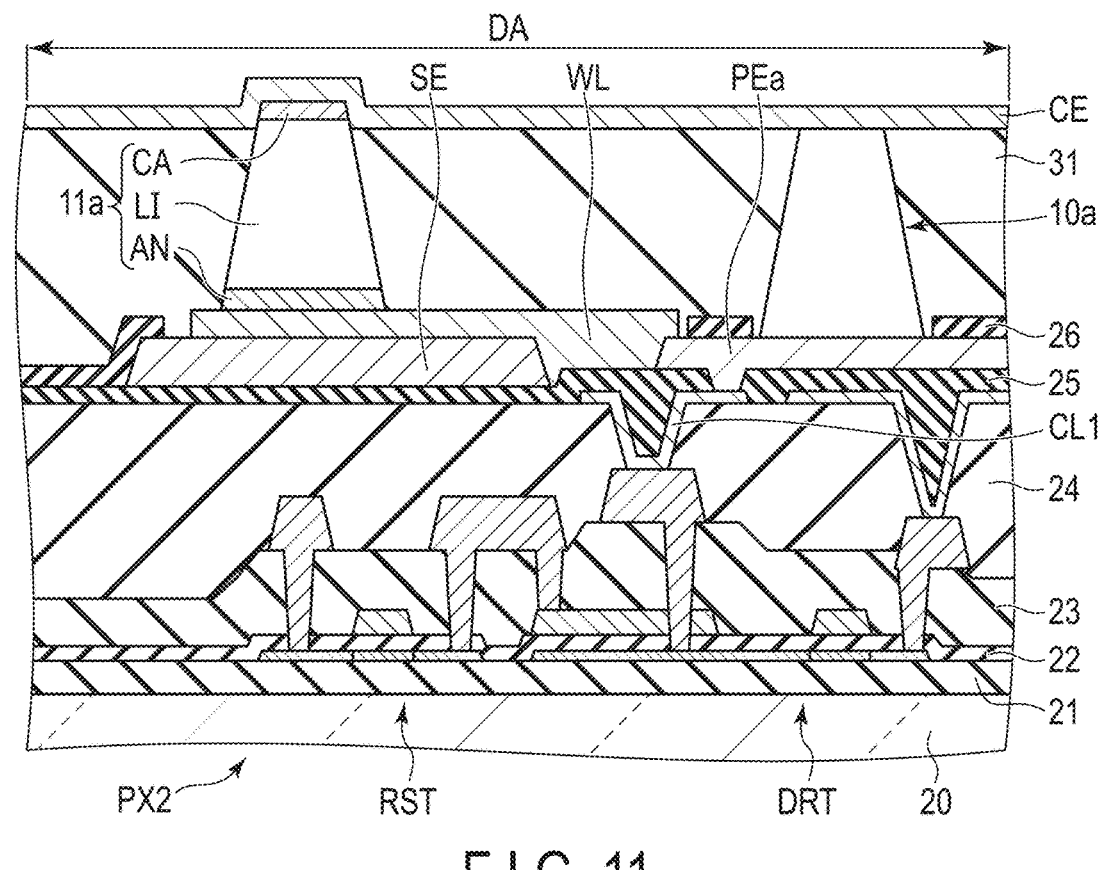
F I G. 11
F I G. 12

DISPLAY PANEL, METHOD OF MANUFACTURING THE SAME, AND SUBSTRATE

CROSS-REFERENCE TO RELATED APPLICATIONS

This application is a Divisional Application of U.S. application Ser. No. 17/330,607, filed May 26, 2021, which is a Continuation Application of PCT Application No. PCT/JP2019/044440, filed Nov. 12, 2019, which is based upon and claiming the benefit of priority from Japanese Patent Application No. 2018-221074, filed Nov. 27, 2018, the entire contents of all of which are incorporated herein by reference.

FIELD

Embodiments described herein relate generally to a display panel, a method of manufacturing the display panel, and a substrate.

BACKGROUND

LED display panels using light emitting diodes (LED) that are spontaneous light-emitting elements are known as display panels. Recently, a display panel (hereinafter referred to as a micro-LED display panel) in which minute light-emitting diodes referred to as micro-LED are mounted on an array substrate has been developed as a higher definition display panel.

Since the micro-LED display is formed such that a large number of chip-like micro-LED are mounted in a display area, unlike the conventional liquid crystal display or organic EL display, both higher definition and larger scale of the display can easily be achieved and the display is focused as a next generation display panel.

BRIEF DESCRIPTION OF THE DRAWINGS

FIG. 1 is a perspective view showing a configuration of a display device according to one of embodiments.

FIG. 2 is a circuit diagram showing the display device.

FIG. 3 is an equivalent circuit diagram showing a sub-pixel of the embodiment.

FIG. 4 is a partially cross-sectional view showing a display panel shown in FIG. 1.

FIG. 5 is a plan view showing a layout of the pixel shown in FIG. 1, illustrating various lines, pixel electrodes, and mounting electrodes.

FIG. 6 is a plan view showing a first pixel and a second pixel of the embodiment, illustrating pixel electrodes, mounting electrodes, light emitting elements, and a wiring layer.

FIG. 7 is a cross-sectional view showing the display panel taken along line VII-VII of FIG. 6, illustrating a first pixel.

FIG. 9 is a diagram illustrating a method of manufacturing the display device according to the above embodiment, and a state in which the light emitting element is irradiated with laser light.

FIG. 10 is a diagram illustrating the manufacturing method, following FIG. 9, and a state in which an additional light emitting element is mounted on the mounting electrode and the wiring layer for connecting the pixel electrode and the mounting electrode is formed.

FIG. 11 is a cross-sectional view showing parts of the display device according to modified example 1 of the embodiment.

FIG. 12 is a plan view showing the first pixel and the second pixel of the display device according to modified example 2 of the above embodiment, illustrating the pixel electrode, the mounting electrode, the light emitting element, and the wiring layer.

DETAILED DESCRIPTION

Figure 8:
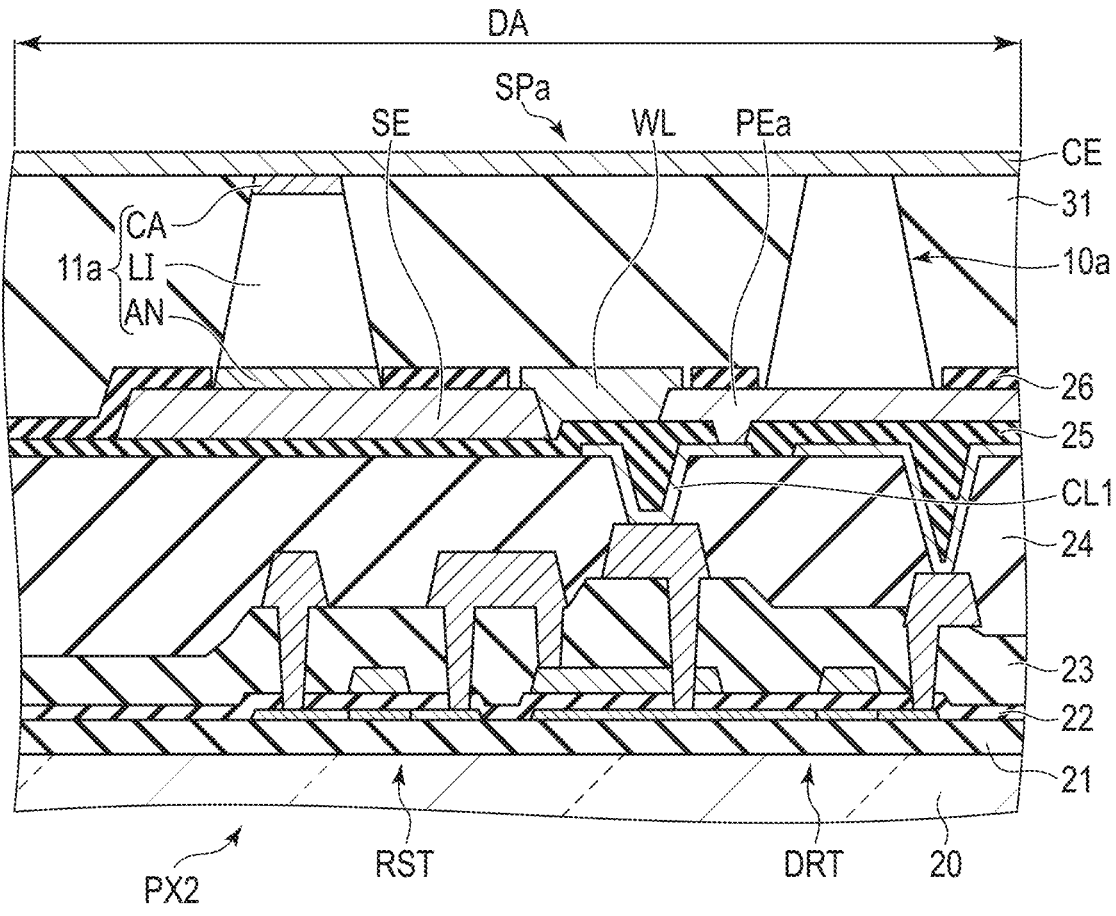
FIG. 8 is a cross-sectional view showing the display panel taken along line VIII-VIII of FIG. 6, illustrating a second pixel.

In general, according to one embodiment, there is provided a display panel comprising: a substrate; a first insulating layer provided on the substrate; and a plurality of pixels provided on the substrate, located in a display area, and including sub-pixels of a plurality of colors, respectively, each of the sub-pixels including: a drive transistor covered with the first insulating layer; a pixel electrode arranged on the first insulating layer, electrically connected to the drive transistor, and supplied with a signal having a current value controlled from the drive transistor; and a light emitting element mounted on the pixel electrode and including a first electrode electrically connected to the pixel electrode, each of the pixels including a mounting electrode arranged on the first insulating layer and located to be spaced apart from the pixel electrode, the mounting electrode being in an electrically floating state in a first pixel of the plurality of pixels.

According to another embodiment, there is provided a method of manufacturing a display panel, comprising: preparing a panel comprising a substrate, a first insulating layer provided on the substrate, and a plurality of pixels provided on the substrate, located in a display area, and including sub-pixels of a plurality of colors, respectively, each of the sub-pixels including a drive transistor covered with the first insulating layer, a pixel electrode arranged on the first insulating layer, electrically connected to the drive transistor, and supplied with a signal having a current value controlled from the drive transistor, and a light emitting element mounted on the pixel electrode and including a first electrode electrically connected to the pixel electrode, each of the pixels including a mounting electrode arranged on the first insulating layer and located to be spaced apart from the pixel electrode, the mounting electrode being in an electrically floating state; inspecting whether emission failure occurs in the plurality of light emitting elements or not, after preparing the panel; when it is determined that the emission failure does not occur in the plurality of light emitting elements of a first pixel, of the plurality of pixels, maintaining the mounting electrode of the first pixel an electrically floating state; and when the emission failure occurs in the light emitting element of a first color of the sub-pixel of the first color of a second pixel, of the plurality of pixels, irradiating the light emitting element of the first color of the second pixel with laser light, mounting an additional light emitting element of the first color on the mounting electrode of the second pixel and electrically connecting a first electrode of the additional light emitting element to the mounting electrode, and electrically connecting the mounting electrode to the drive transistor of the sub-pixel of the first color, in the second pixel.

According to yet another embodiment, there is provided a substrate comprising in one pixel a first color micro-light-emitting diode, a second color micro-light-emitting diode, a third color micro-light-emitting diode, a first electrode on which the first color micro-light-emitting diode is mounted, a second electrode on which the second color micro-light-emitting diode is mounted, a third electrode on which the third color micro-light-emitting diode is mounted, and a fourth electrode, the first color micro-light-emitting diode, the second color micro-light-emitting diode, and the third color micro-light-emitting diode having different colors, the fourth electrode being in an electrically floating state.

Each embodiment of the present invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are schematically illustrated in the drawings, compared to the actual modes. However, the schematic illustration is merely an example, and adds no restrictions to the interpretation of the invention. In addition, in the specification and drawings, the same elements as those described in connection with preceding drawings are denoted by like reference numerals, and detailed description thereof is omitted unless otherwise necessary.

EMBODIMENT

First, a display device according to one of the embodiments will be described. FIG. 1 is a perspective view showing a configuration of a display device 1 according to one of the embodiments. FIG. 1 is a perspective view showing a configuration of a display device 1 according to one of the embodiments. FIG. 1 shows a three-dimensional space defined by a first direction X, a second direction Y orthogonal to the first direction X, and a third direction Z orthogonal to the first direction X and the second direction Y. Incidentally, the first direction X and the second direction Y are orthogonal to each other, but may intersect at an angle other than 90 degrees. In addition, the third direction Z is defined as an upper or upward direction while a direction opposite to the third direction Z is defined as a lower or downward direction, in the present embodiment. According to "a second member above/on a first member" and "a second member below/under a first member", the second member may be in contact with the first member or may be remote from the first member.

In the embodiment, an example where the display device 1 is a micro-LED display device using a micro-light-emitting diode [hereinafter referred to as a micro-light emitting diode (micro-LED), which is a spontaneous light-emitting element] will be mainly described below.

As shown in FIG. 1, the display device 1 comprises a display panel 2, a first circuit substrate 3, a second circuit substrate 4, and the like. Incidentally, the display panel 2 may be referred to as a substrate.

The display panel 2 has, for example, a rectangular shape. In the example illustrated, shorter sides EX of the display panel 2 are parallel to the first direction X and longer sides EY of the display panel 2 are parallel to the second direction Y. The third direction Z corresponds to a thickness direction of the display panel 2. The main surface of the display panel 2 is parallel to an X-Y plane defined by the first direction X and the second direction Y. The display panel 2 includes a display area DA and a non-display area NDA other than the display area DA. The non-display area NDA includes a terminal area MT. In the example illustrated, the non-display area NDA surrounds the display area DA.

The display area DA is an area for displaying an image and includes, for example, a plurality of pixels PX arrayed in a matrix.

The terminal area MT is provided along the shorter sides EX of the display panel 2 and includes a terminal for electrically connecting the display panel 2 to an external device or the like.

The first circuit substrate 3 is mounted on the terminal area MT and is electrically connected to the display panel 2. The first circuit substrate 3 is, for example, a flexible printed circuit. The first circuit substrate 3 comprises a driver IC chip (hereinafter referred to as a panel driver) 5 which drives the display panel 2, and the like. Incidentally, in the example illustrated, the panel driver 5 is mounted on the first circuit substrate 3 but may be mounted under the first circuit substrate 3. Alternatively, the panel driver 5 may be mounted on a part other than the first circuit substrate 3 and may be mounted on, for example, the second circuit substrate 4. The second circuit substrate 4 is, for example, a flexible printed circuit. The second circuit substrate 4 is connected to the first circuit substrate 3, for example, at a position under the first circuit substrate 3.

The above-described panel driver 5 is connected to a control board (not shown) via, for example, the second circuit substrate 4. For example, the panel driver 5 executes control of displaying an image on the display panel 2 by driving a plurality of pixels PX, based on an image signal output from the control board.

Incidentally, the display panel 2 may include a fold area BA represented by hatch lines. The fold area BA is an area which is folded when the display device 1 is accommodated in the housing of the electronic apparatus or the like. The fold area BA is located on the terminal area MT side of the non-display area NDA. In a state in which the fold area BA is folded, the first circuit substrate 3 and the second circuit substrate 4 are arranged under the display panel 2 so as to be opposed to the display panel 2.

FIG. 2 is a circuit diagram showing the display device 1. FIG. 3 is an equivalent circuit diagram showing a sub-pixel SP of the embodiment. Incidentally, not all of the various lines are shown in FIG. 2.

As shown in FIG. 2 and FIG. 3, the display panel 2 comprises an insulating substrate 20 having a light transmitting property such as a resin substrate or a glass substrate, a plurality of pixels PX arrayed in a matrix on the insulating substrate 20 in the display area DA, various lines, scanning line driving circuits YDR1 and YDR2, and a signal line driving circuit XDR.

The various lines include a plurality of first scanning lines Sga, a plurality of second scanning lines Sgb, a plurality of third scanning lines Sgc, a plurality of fourth scanning lines Sgd, a plurality of video signal lines VL, a plurality of high potential power supply lines SLa, a plurality of reset lines Sgr, and a plurality of initialization lines Sgi.

In the embodiment, the first scanning lines Sga, the third scanning lines Sgc, and the fourth scanning lines Sgd are connected to the scanning line driving circuit YDR1 and extend in the first direction X. The second scanning lines Sgb are connected to the scanning line driving circuit YDR and are provided so as to extend in the first direction X. The video signal line VL are connected to the signal line driving circuit XDR and are provided so as to extend in the second direction Y. The high potential power supply lines SLa, the reset lines Sgr, and the initialization lines Sgi are provided so as to extend in the second direction Y. The display panel 2 is provided with not only the high potential power supply line SLa fixed to a high potential Pvdd, but also a low potential power supply line SLb fixed to a low potential Pvss. The high potential power supply line SLa is connected to a high potential power supply, and the low potential power supply line SLb is connected to a low potential power supply.

The scanning line driving circuit YDR1 is configured to drive the first scanning lines Sga, the third scanning lines Sgc, and the fourth scanning lines Sgd. The scanning line driving circuit YDR2 is configured to drive the second scanning lines Sgb. The signal line driving circuit XDR is configured to drive the video signal line VL. The scanning line driving circuits YDR1 and YDR2 and the signal line driving circuit XDR are formed on the insulating substrate 20 in the non-display area NDA and configures a driver 7 together with the panel driver 5.

Each of the pixels PX is provided with a plurality of sub-pixels SP. Each of the sub-pixels SP includes the light emitting element 10 and a pixel circuit that supplies a drive current to the light emitting element 10. The light emitting element 10 is, for example, a self-luminous element, and is a micro-light-emitting diode (hereinafter referred to as a micro-LED [Light Emitting Diode]) in the embodiment. The display device 1 of the embodiment is a micro-LED display device.

The pixel circuit of each sub-pixel SP is a voltage signal type pixel circuit that controls the light emission of the light emitting element 10 in accordance with the video signal Vsig formed of a voltage signal, and includes a reset switch RST, a pixel switch SST, an initialization switch IST, an output switch BCT, a drive transistor DRT, a storage capacitor Cs, and an auxiliary capacitor Cad. The storage capacitor Cs and the auxiliary capacitor Cad are capacitors. The auxiliary capacitor Cad is an element provided to adjust the amount of light emission current and may be unnecessary in some cases.

The reset switch RST, the pixel switch SST, the initialization switch IST, the output switch BCT, and the drive transistor DRT are composed of thin-film transistors (TFTs). In the embodiment, the reset switch RST, the pixel switch SST, the initialization switch IST, the output switch BCT, and the drive transistor DRT are composed of TFTs of the same conductivity type, for example, N-channel type. Incidentally, one or more of the reset switch RST, the pixel switch SST, the initialization switch IST, the output switch BCT, and the drive transistor DRT may be configured by P-channel TFTs. In this case, an N-channel TFT and a P-channel TFT may be formed at the same time. The reset switch RST, the pixel switch SST, the initialization switch IST, and the output switch BCT need only to function as switches, and need not be composed of TFTs.

In the display device 1 according to the embodiment, all the TFTs that configure the respective drive transistors DRT and the switches are top-gate thin-film transistors formed in the same process with the same layer structure and using polycrystalline silicon for the semiconductor layer. Incidentally, the semiconductor layer may use a semiconductor other than polycrystalline silicon such as amorphous silicon or an oxide semiconductor.

Each of the reset switch RST, the pixel switch SST, the initialization switch IST, the output switch BCT, and the drive transistor DRT includes a first terminal, a second terminal, and a control terminal. In the present embodiment, the first terminal is used as a source electrode, the second terminal is used as a drain electrode, and the control terminal is used as a gate electrode.

In the pixel circuit of the pixel PX, the drive transistor DRT and the output switch BCT are connected in series with the light emitting element 10 at positions between the high potential power supply line SLa and the low potential power supply line SLb. The high potential power supply line SLa (high potential Pvdd) is set to a potential of, for example, 10 V and the low potential power supply line SLb (low potential Pvss) is set to a potential of, for example, 1.5 V.

In the output switch BCT, a drain electrode is connected to the high potential power supply line SLa, a source electrode is connected to the drain electrode of the drive transistor DRT, and a gate electrode is connected to the second scanning line Sgb. The output switch BCT is thereby controlled to be on (conductive state) or off (non-conductive state) by a control signal BG supplied to the second scanning line Sgb. The output switch BCT controls the light emission period of the light emitting element 10 in response to the control signal BG.

In the drive transistor DRT, a drain electrode is connected to the source electrode of the output switch BCT, and a source electrode is connected to one of electrodes (in this example, an anode) of the light emitting element 10. The other electrode (in this example, a cathode) of the light emitting element 10 is connected to the low potential power supply line SLb. The drive transistor DRT outputs a drive current having a current amount corresponding to the video signal Vsig to the light emitting element 10.

In the pixel switch SST, a source electrode is connected to the video signal line VL, a drain electrode is connected to the gate electrode of the drive transistor DRT, and a gate electrode is connected to the third scanning line Sgc that functions as a gate line for signal write control. The pixel switch SST is controlled to be on and off by a control signal SG supplied from the third scanning line Sgc. Then, the pixel switch SST controls connection and disconnection between the pixel circuit and the video signal line VL and takes an image signal Vsig from the video signal line VL into the pixel circuit, in response to the control signal SG.

In the initialization switch IST, a source electrode is connected to the initialization line Sgi, a drain electrode is connected to the gate electrode of the drive transistor DRT, and a gate electrode is connected to the first scanning line Sga. The initialization switch IST is controlled to be on and off by a control signal IG supplied from the first scanning line Sga. Then, the initialization switch IST controls connection and disconnection between the pixel circuit and the initialization line Sgi in response to the control signal IG. The initialization potential (initialization voltage) Vini can be taken into the pixel circuit from the initialization line Sgi by connecting the pixel circuit with the initialization line Sgi by the initialization switch IST.

The reset switch RST is connected between the source electrode of the drive transistor DRT and the reset lines Sgr. The gate electrode of the reset switch RST is connected to the fourth scanning line Sgd that functions as a reset control gate line. As described above, the reset line Sgr is connected to a reset power supply and fixed to a reset potential Vrst that is a constant potential. The reset switch RST is switched to a conductive state (on) or a non-conductive state (off) in response to the control signal RG supplied through the fourth scanning line Sgd. When the reset switch RST is switched to be the on state, the potential of the source electrode of the drive transistor DRT can be reset to the reset potential Vrst.

The storage capacitor Cs is connected between the gate electrode and the source electrode of the drive transistor DRT. The auxiliary capacitor Cad is connected between the source electrode of the drive transistor DRT and the high potential power supply line SLa serving as a constant potential line.

In contrast, the panel driver 5 shown in FIG. 2 controls the scanning line driving circuits YDR1 and YDR2 and the signal line driving circuit XDR. The panel driver 5 receives a digital video signal and a synchronization signal supplied from the outside, and generates a vertical scanning control signal for controlling vertical scanning timing and a horizontal scanning control signal for controlling horizontal scanning timing, based on the synchronization signal.

Then, the panel driver 5 supplies the vertical scanning control signal and the horizontal scanning control signal to each of the scanning line driving circuits YDR1 and YDR2 and the signal line driving circuit XDR, and supplies the digital video signal and the initialization signal to the signal line driving circuit XDR in synchronization with the horizontal and vertical scanning timing.

The signal line driving circuit XDR converts digital video signals sequentially obtained in each horizontal scanning period under the control of the horizontal scanning control signal into an analog format and supplies video signals Vsig corresponding to gradation to a plurality of video signal lines VL. The panel driver 5 fixes the high potential power supply line SLa to the high potential Pvdd, fixes the reset line Sgr to the reset potential Vrst, and fixes the initialization line Sgi to the initialization potential Vini. Incidentally, the potential of the high potential power supply line SLa, the potential of the reset line Sgr, and the potential of the initialization line Sgi may be set via the signal line driving circuit XDR.

A start pulse signal STV, a clock signal CKV, and the like are supplied to the scanning line driving circuits YDR1 and YDR2 by the panel driver 5.

The scanning line driving circuits YDR1 and YDR2 include a shift register, an output buffer, and the like (not shown), sequentially transfer the start pulse signal STV to the shift register of the next stage, and supplies four types of control signals, i.e., control signals IG, BG, SG, and RG to the sub-pixels SP of each row via the output buffer. The first scanning line Sga, the second scanning line Sgb, the third scanning line Sgc, and the fourth scanning line Sgd are thereby driven by the control signals IG, BG, SG, and RG, respectively.

Next, the drive transistor DRT, the reset switch RST, the pixel electrode PE, the mounting electrode SE, the light emitting element 10, the low potential power supply line SLb, the common electrode CE, and the like will be described with reference to FIG. 4. FIG. 4 is a partially cross-sectional view showing the display panel 2 shown in FIG. 1. Incidentally, in FIG. 4, the display panel 2 is drawn such that the display surface, i.e., the light emission surface faces upward and the back surface faces downward.

As shown in FIG. 4, the display panel 2 comprises an insulating substrate (substrate) 20, insulating layers 21, 22, 23, 24, 25, and 26 provided on the insulating substrate 20, and a plurality of pixels PX. The plurality of pixels PX are provided on the insulating substrate 20, are located in the display area DA, and include sub-pixels SP of a plurality of colors.

A glass substrate of quartz, alkali-free glass, and the like or a resin substrate of polyimide, and the like can be mainly used as the insulating substrate 20. The material of the insulating substrate 20 may be a material withstanding a processing temperature at the time of manufacturing the TFT. When the insulating substrate 20 is a flexible resin substrate, the display device 1 can be composed as a sheet display. The resin substrate may be formed of not polyimide, but the other resin material. Incidentally, when polyimide or the like is used for the insulating substrate 20, the insulating substrate 20 may be referred to as an organic insulating layer or a resin layer, more appropriately.

The insulating layer 21 is provided on the insulating substrate 20. Various TFTs are formed on the insulating layer 21. In the display area DA, the drive transistor DRT, the reset switch RST and the like are formed on the insulating layer 21 and, in the non-display area NDA, the TFT and the like that configure the scanning line driving circuit YDR are formed on the insulating layer 21. The TFT such as the drive transistor DRT comprises a semiconductor layer SC, a gate electrode GE, a first electrode E1, and a second electrode E2.

The semiconductor layer SC is arranged on the insulating layer 21. The insulating layer 22 is provided on the insulating layer 21 and the semiconductor layer SC. The gate electrode GE is arranged on the insulating layer 22 and is opposed to the channel region of the semiconductor layer SC. The insulating layer 23 is provided on the insulating layer 22 and the gate electrode GE. The first electrode E1 and the second electrode E2 are arranged on the insulating layer 23. The first electrode E1 and the second electrode E2 pass through contact holes formed in the insulating layer 22 and the insulating layer 23, respectively, and are electrically connected to the corresponding semiconductor layer SC.

In the present embodiment, a conductive layer CL is formed on the insulating layer 22. The first electrode E1 of the drive transistor DRT is electrically connected to not only the corresponding semiconductor layer SC, but also the conductive layer CL. The second electrode E2 of the reset switch RST is electrically connected to not only the corresponding semiconductor layer SC, but also the conductive layer CL. For this reason, the drive transistor DRT and the reset switch RST are electrically connected via the conductive layer CL.

In the non-display area NDA, the low potential power supply line SLb is arranged on the insulating layer 23. The insulating layer 24 is provided on the insulating layer 23, the first electrode E1, the second electrode E2, and the low potential power supply line SLb.

A first conductive layer CL1 and a second conductive layer CL2 are arranged on the insulating layer 24. The first conductive layer CL1 is electrically connected to the first electrode E1 through a contact hole formed in the insulating layer 24. The second conductive layer CL2 is electrically connected to the second electrode E2 through a contact hole formed in the insulating layer 24.

The insulating layer 25 is provided on the insulating layer 24, the first conductive layer CL1, and the second conductive layer CL2. The insulating layer 25 functions as a first insulating layer. The pixel electrode PE and the mounting electrode SE are arranged on the insulating layer 25. The pixel electrode PE is electrically connected to the first conductive layer CL1 through a contact hole CH formed in the insulating layer 25. The mounting electrode SE is in an electrically floating state.

The insulating layers 21, 22, 23, 24, 25, and 26 are formed of an inorganic insulating material or an organic insulating material. In the present embodiment, the insulating layers 21, 22, 23, 25, and 26 are formed of, for example, silicon oxide ($SiO_2$) or silicon nitride (SiN) as the inorganic insulating material. The insulating layer 24 is formed of, for example, photosensitive acrylic as the organic insulating material.

The semiconductor layer SC is formed of low temperature polycrystalline silicon as polycrystalline silicon. However, the semiconductor layer SC may be formed of a semiconductor other than polycrystalline silicon, such as amorphous silicon or an oxide semiconductor. The gate electrode GE and the conductive layer CL are located in the same layer and are formed of a metal as the same conductive material. For example, the gate electrode GE and the conductive layer CL are formed of molybdenum-tungsten (MoW).

The first electrode E1, the second electrode E2, and the low potential power supply line SLb are located in the same layer and are formed of a metal as the same conductive material. For example, each of the first electrode E1, the second electrode E2, and the low potential power supply line SLb adopts a three-layer stacked structure (Ti-based/Al-based/Ti-based), and includes a lower layer formed of a metal material containing titanium (Ti) as a main component, such as Ti or an alloy containing Ti, an intermediate layer formed of a metal material containing aluminum (Al) as a main component, such as Al or an alloy containing Al, and an upper layer formed of a metal material containing Ti as a main component, such as Ti or an alloy containing Ti. The example of the top-gate TFT has been described, but the TFT may be a bottom-gate TFT.

Switches of the drive transistor DRT and the like are covered with the insulating layer 25.

The first conductive layer CL1 and the second conductive layer CL2 are located in the same layer and are formed of a metal or a transparent conductive material as the same conductive material. The pixel electrode PE and the mounting electrode SE are located in the same layer and are formed of a metal as the same conductive material. For example, each of the pixel electrode PE and the mounting electrode SE includes a single conductive layer, a three-layer stacked structure, or a two-layer stacked structure.

In the three-layer stacked structure, the pixel electrode PE and the mounting electrode SE are not limited to the Ti-based/Al-based/Ti-based structure, but may be the Mo-based/Al-based/Mo-based structure. In the Mo-based/Al-based/Mo-based structure, the pixel electrode PE and the mounting electrode SE include a lower layer formed of a metal material containing molybdenum (Mo) or as a main component such as Mo or an alloy containing Mo, an intermediate layer formed of a metal material containing Al as a main component such as Al or an alloy containing Al, and an upper layer formed of a metal material containing Mo as a main component such as Mo or an alloy containing Mo.

In the two-layer stacked structure, the pixel electrode PE and the mounting electrode SE include a lower layer formed of a metal material containing Al as a main component and an upper layer formed of a metal material containing Ti as a main component. Alternatively, each of the pixel electrode PE and the mounting electrode SE includes a lower layer formed of a metal material containing Mo as a main component and an upper layer formed of a metal material containing Al as a main component. Incidentally, the pixel electrode PE and the mounting electrode SE may be formed of a transparent conductive material.

Each pixel PX includes a mounting electrode SE. The mounting electrode SE is arranged on the insulating layer 25 and is spaced apart from the pixel electrode PE. The pixel electrode PE is electrically connected to the drive transistor DRT, and is supplied with a signal whose current value is controlled from the drive transistor DRT.

The insulating layer 26 is provided on the insulating layer 25, the pixel electrode PE, and the mounting electrode SE. The insulating layer 26 functions as a second insulating layer. Although not shown, the insulating layer 26 is located on the plurality of pixel electrodes PE and the plurality of mounting electrodes SE, covers the plurality of pixel electrodes PE and the plurality of mounting electrodes SE, and exposes the plurality of light emitting elements 10. The insulating layer 26 includes an opening for mounting the light emitting element 10 on a part of the surface of the pixel electrode PE and an opening for exposing a part of the surface of the mounting electrode SE. The size of the opening of the insulating layer 26 is set to be significantly larger than a light emitting element 10 in consideration of the mount displacement amount in a step of mounting the light emitting element 10, and the like. For example, when the light emitting element 10 substantially has a mount area of 10 $\mu$m×10 $\mu$m, the opening is desirably secured to be substantially 20 $\mu$m×20 $\mu$m.

The light emitting element 10 is mounted on the pixel electrode PE in the display area DA. The light emitting element 10 includes an anode AN serving as a first electrode, a cathode CA serving as a second electrode, and an emitting layer LI emitting light. The light emitting elements 10 having the first, second, and third emission colors, respectively, are prepared and the anodes AN are electrically connected and fixed to the corresponding pixel electrodes PE. In the present embodiment, the first color is red (R), the second color is green (G), and the third color is blue (B).

The junction between the anode AN of the light emitting element 10 and the pixel electrode PE is not particularly limited as long as desirable conduction can be secured between them and the stacked structure from the insulating substrate 20 to the insulating layer 26 is not damaged. For example, a reflow process using a soldering material molten at a low temperature, a method such as placing the light emitting element 10 on the pixel electrode PE via a conductive paste and then sintering the elements, or a method of solid-state welding such as ultrasonic welding by using the similar materials for the surface of the pixel electrode PE and the anode AN of the light emitting element 10 can be adopted. The light emitting element 10 includes the cathode CA on a side opposite to the anode AN electrically connected to the pixel electrode PE.

After the light emitting element 10 is mounted, an element insulating layer 31 is provided on the insulating layer 25, the pixel electrode PE, the mounting electrode SE, and the insulating layer 26. The element insulating layer 31 is buried in a gap part between the light emitting elements 10 and is formed of a resin material. The element insulating layer 31 exposes the surfaces of the cathodes CA, of the light emitting elements 10.

The common electrode CE is located at least in the display area DA, is arranged on the insulating layer 26 and the plurality of light emitting elements 10, and covers the light emitting elements 10 of the plurality of pixels. The common electrode CE is arranged on the surface of the plurality of cathodes CA on the common electrode CE side and on the element insulating layer 31, is in contact with the plurality of cathodes CA, and is electrically connected to the plurality of cathodes CA. The common electrode CE is shared by the plurality of sub-pixels SP.

The common electrode CE extends in the non-display area NDA and is electrically connected to the low potential power supply line SLb in the non-display area NDA. The common electrode CE is in contact with the low potential power supply line SLb through the contact holes formed in the element insulating layer 31, the insulating layer 26, the insulating layer 25, and the insulating layer 24. For this reason, the common electrode CE is held at the same constant potential as the potential of the low potential power supply line SLb, and electrically connects the low potential power supply line SLb with the cathodes CA of all the light emitting elements 10.

The common electrode CE needs to be formed as a transparent electrode in order to extract the light emitted from the light emitting elements 10, and is formed of, for example, ITO as a transparent conductive material. In contrast, when side wall parts of the light emitting elements 10 are insulated by a protective film or the like, the gap does not need to be filled with a resin material or the like and the resin material needs only to insulate at least the anodes AN, the surfaces of the pixel electrodes PE exposed from the anodes AN, and the surfaces of the mounting electrodes SE. In this case, the element insulating layer 31 is formed with a thickness which does not reach the cathodes CA of the light emitting elements 10 and then the common electrode CE is formed. Parts of the unevenness caused by the mounting of the light emitting elements 10 remain on the surface on which the common electrode CE is formed, but the material forming the common electrode CE may continuously cover the parts without breakage.

As described above, the display panel 2 has a structure from the insulating substrate 20 to the common electrode CE. For example, the display device 1 using the light emitting elements 10 according to the present embodiment as the display elements is configured as described above. Incidentally, a cover member such as a cover glass or a touch panel board may be provided on the common electrode CE as needed.

Next, the layout of the pixel PX will be described. FIG. 5 is a plan view showing the layout of the pixel PX shown in FIG. 1, and is a view showing various lines, the pixel electrodes PE, and the mounting electrode SE.

As shown in FIG. 5, each pixel PX includes a plurality of sub-pixels SP. In the present embodiment, each pixel PX includes sub-pixels SP of three colors, i.e., a sub-pixel SPa of a first color, a sub-pixel SPb of a second color, and a sub-pixel SPc of a third color. The sub-pixel SPa includes a pixel electrode PEa, the sub-pixel SPb includes a pixel electrode PEb, and the sub-pixel SPc includes a pixel electrode PEc.

The pixel electrode PEa is adjacent to the mounting electrode SE in the second direction Y. The pixel electrode PEb is adjacent to the mounting electrode SE in the first direction X. The pixel electrode PEc is adjacent to the pixel electrode PEa in the first direction X and is adjacent to the pixel electrode PEb in the second direction Y. In planar view, the size of the pixel electrode PEa is larger than the size of each of the pixel electrode PEb and the pixel electrode PEc. The size of the mounting electrode SE is substantially the same as the size of the pixel electrode PEa, and is larger than the size of each of the pixel electrode PEb and the pixel electrode PEc.

The pixel electrode PE includes a first region R1 for mounting the light emitting element 10, a second region R2 for connecting the pixel electrode PE with the mounting electrode SE at the time of repairing to be described later, and a third region R3 for electrically connecting with the first conductive layer CL1. The mounting electrode SE includes the first region R1 and the second region R2. In the pixel electrode PEa and the pixel electrode PEb, the second region R2 and the third region R3 are adjacent to each other or are partially overlaid on each other. In the pixel electrode PEc, the second region R2 and the third region R3 are located at a distance. In each pixel PX, the plurality of second regions R2 are located close to each other.

Next, the first pixel PX1 and the second pixel PX2, of the plurality of pixels PX of the display panel 2, will be described. FIG. 6 is a plan view showing the first pixel PX1 and the second pixel PX2 of the present embodiment, and is a view showing the pixel electrodes PE, the mounting electrodes SE, the light emitting elements 10, and a wiring layer WL. FIG. 7 is a cross-sectional view showing the display panel 2 taken along line VII-VII in FIG. 6 and a view showing the first pixel PX1. FIG. 8 is a cross-sectional view showing the display panel 2 taken along line VIII-VIII in FIG. 6 and a view showing the second pixel PX2.

As shown in FIG. 6, the plurality of pixels PX of the display panel 2 include a first pixel PX1 and a second pixel PX2.

As shown in FIG. 6 and FIG. 7, the light emitting element 10a of the first color is mounted on the pixel electrode PEa, the light emitting element 10b of the second color is mounted on the pixel electrode PEb, and the light emitting element 10c of the third color is mounted on the pixel electrode PEc, in the first pixel PX1. All the light emitting elements 10 of the first pixel PX1 are normal light emitting elements. For this reason, the mounting electrode SE is in an electrically floating state, in the first pixel PX1. An additional light emitting element is not mounted on the mounting electrode SE.

The insulating layer 26 includes a first opening OP1 exposing the pixel electrode PEa and a fourth opening OP4 exposing the mounting electrode SE, in the first pixel PX1. The light emitting element 10a is connected to the pixel electrode PEa through the first opening OP1.

Although not shown, the insulating layer 26 further includes a second opening that exposes the pixel electrode PEb and a third opening that exposes the pixel electrode PEc, in the first pixel PX1. The light emitting element 10b is connected to the pixel electrode PEb through the second opening. The light emitting element 10c is connected to the pixel electrode PEc through the third opening.

In contrast, as shown in FIG. 6 and FIG. 8, the light emitting element 10a of the first color is mounted on the pixel electrode PEa, and the light emitting element 10b of the second color is mounted on the pixel electrode PEb, and the light emitting element 10c of the third color is mounted on the pixel electrode PEc, in the second pixel PX2. In the second pixel PX2, the light emitting elements 10b and 10c are normal light emitting elements, but the light emitting element 10a of the first color is not a normal light emitting element. In the second pixel PX2, the current does not flow between the pixel electrode PEa and the common electrode CE via the light emitting element 10a. Incidentally, the light emitting element 10a of the second pixel PX2 may be damaged and the cathode CA may not exist in the light emitting element 10a.

For this reason, the second pixel PX2 further includes an additional light emitting element 11a of the first color as a light emitting element of the same color as the light emitting element 10a that does not illuminate. By providing the additional light emitting element 11a in the second pixel PX2, a situation in which the first color is insufficient as the emission color in the second pixel PX2 can be avoided.

The additional light emitting element 11a is a micro-LED. The additional light emitting element 11a includes an anode AN as a first electrode, a cathode CA as a second electrode, and a light emitting layer LI that emits light. The additional light emitting element 11a is mounted on the mounting electrode SE of the second pixel PX2, and the anode AN of the additional light emitting element 11a is electrically connected to the mounting electrode SE. In the second pixel PX2, the mounting electrode SE is electrically connected to the drive transistor DRT of the sub-pixel SPa of the first color and is supplied with a signal whose current value is controlled from the drive transistor DRT. In the second pixel PX2, when the signal whose current value is controlled is supplied from the drive transistor DRT of the sub-pixel SPa of the first color to the pixel electrode PEa and the mounting electrode SE of the sub-pixel SPa of the first color, the light emitting element 10a does not emit light, but the additional light emitting element 11a emits light.

In the present embodiment, since the mounting electrode SE is electrically connected to the drive transistor DRT of the sub-pixel SPa, the second pixel PX2 further includes the wiring layer WL. The wiring layer WL is located on the insulating layer 25 and connects the pixel electrode PEa of the second pixel PX2 with the mounting electrode SE. The wiring layer WL is in contact with the second region R2 of the mounting electrode SE and the second region R2 of the pixel electrode PEa. For example, the wiring layer WL is formed of tungsten (W), in a metallized layer.

When the additional light emitting element 11a and the wiring layer WL of the second pixel PX2 are considered as described above, the insulating layer 26 is located on the plurality of pixel electrodes PE, the plurality of mounting electrodes SE, and the wiring layer WL, covers the plurality of pixel electrodes PE, the plurality of mounting electrodes SE, and the wiring layer WL, and exposes the plurality of light emitting elements 10 and the additional light emitting element 11a. The common electrode CE is arranged on the insulating layer 26, the plurality of light emitting elements 10, and the additional light emitting element 11a. Each cathode CA of the additional light emitting element 11a is electrically connected to the common electrode CE.

Incidentally, when a pixel PX including the light emitting element 10 that is not turned on exists in addition to the second pixel PX2 in the plurality of pixels PX, the pixel PX may be configured similarly to the second pixel PX2. In other words, the additional light emitting element 11 of the first color, the second color, or the third color and the wiring layer WL may be added to the pixel PX including the light emitting element 10 that does not illuminate, and the mounting electrode SE and the pixel electrode PE where the light emitting element 10 that does not illuminate is mounted may be connected in the wiring layer WL.

The display device 1 of the present embodiment is configured as described above.

When the light emitting element 10 is a micro-light-emitting diode, the light emitting element 10a may be referred to as a first color micro-light-emitting diode, the light emitting element 10b may be referred to as a second color micro-light-emitting diode, and the light emitting element 10c may be referred to as a third color micro-light-emitting diode. In addition, the pixel electrode PEa may be referred to as a first electrode, the pixel electrode PEb may be referred to as a second electrode, the pixel electrode PEc may be referred to as a third electrode, and the mounting electrode SE may be referred to as a fourth electrode.

Next, a method for manufacturing the display device 1 will be described. A method of manufacturing the display panel 2, of the method of manufacturing the display device 1, will be described. FIG. 9 is a view illustrating the method of manufacturing the display device 1 according to the present embodiment, and a view showing a state in which the light emitting element 10a is irradiated with laser light. FIG. 10 is a view illustrating the above-described manufacturing method, following FIG. 9, and a view in which the additional light emitting element 11a is mounted on the mounting electrode SE, and the wiring layer WL connecting the pixel electrode PEa and the mounting electrode SE is formed.

As shown in FIG. 9, when the method of manufacturing the display panel 2 is started, a panel PNL including the stacked structure from the insulating substrate 20 to the insulating layer 26 is first prepared. The panel PNL is a structure serving as a base of the display panel 2. The panel PNL comprises the insulating substrate 20, the insulating layer 25, a plurality of pixels PX including sub-pixels SP of a plurality of colors, the insulating layer 26, and the like. Each sub-pixel SP includes the drive transistor DRT, the pixel electrode PE, and the light emitting element 10. At this point, the mounting electrodes SE of all the pixels PX are in an electrically floating state. The panel PNL does not include the additional light emitting element 11, the element insulating layer 31, or the common electrode CE.

After preparing the panel PNL as described above, it is inspected whether emission failure occurs in the plurality of light emitting elements 10 or not. At the time of inspection, the light emitting elements 10 are electrically inspected by applying a probe to the cathode CA of each light emitting element 10, or the like. The determination as to whether or not the emission failure occurs in the light emitting elements 10 can be executed, for example, visually, but the emission failure can also be executed mechanically with a sensor. Incidentally, the emission failure of the light emitting elements 10 includes not only a case where the light emitting element 10 does not illuminate at all, but also a case where the luminance level of the light emitted from the light emitting elements 10 is less than the threshold value. The first pixel PX1 and the second pixel PX2 of the plurality of pixels PX will be focused below.

When it is determined that the emission failure does not occur in the plurality of light emitting elements 10 of the first pixel PX1, of the plurality of pixels PX, the mounting electrode SE of the first pixel PX1 is maintained in an electrically floating state (FIG. 6).

In contrast, when the emission failure occurs in the light emitting element 10a of the second pixel PX2, of the plurality of pixels PX, the light emitting element 10a of the second pixel PX2 is irradiated with laser light to damage the light emitting element 10a, and the light emitting element 10a is thereby damaged. At this time, the cathode CA may not exist in the light emitting element 10a. It is desirable that no current flows between the pixel electrode PEa and the common electrode CE via the light emitting element 10a where the emission failure occurs. A decrease in the amount of current flowing through the additional light emitting element 11a can be thereby suppressed.

As shown in FIG. 10, subsequently, the additional light emitting element 11a of the first color is mounted on the mounting electrode SE of the second pixel PX2, and the anode AN of the additional light emitting element 11a is electrically connected to the mounting electrode SE. Thus, the mounting electrode SE can be electrically connected to the drive transistor DRT of the sub-pixel SPa, in the second pixel PX2.

Next, the mounting electrode SE is electrically connected to the drive transistor DRT of the sub-pixel SPa, in the second pixel PX2. At this time, the wiring layer WL connecting the pixel electrode PEa and the mounting electrode SE is formed on the insulating layer 25. When forming the wiring layer WL, tungsten is locally deposited by laser Chemical Vapor Deposition (CVD) of irradiating the panel PNL with laser light in an atmosphere of tungsten gas to form a metallized layer.

Incidentally, unlike the order of the manufacturing steps of the present embodiment, the additional light emitting element 11a may be mounted after forming the wiring layer WL.

After mounting the additional light emitting element 11a and forming the wiring layer WL, the insulating layer 26 is further formed. The insulating layer 26 is located on the plurality of pixel electrodes PE, the plurality of mounting electrodes SE, and the wiring layer WL, and can cover the plurality of pixel electrodes PE, the plurality of mounting electrodes SE, and the wiring layer WL. The insulating layer 26 exposes the plurality of light emitting elements 10 and the additional light emitting element 11a.

Subsequently, as shown in FIG. 8, the element insulating layer 31 is formed on the insulating layer 26 and the wiring layer WL. Next, the common electrode CE is formed on the insulating layer 26, the wiring layer WL, the plurality of light emitting elements 10, and the additional light emitting element 11. Accordingly, the common electrode CE is electrically connected to the cathodes CA of the plurality of light emitting elements 10 and the additional light emitting element 11a, and is shared by the plurality of sub-pixels SP of the plurality of pixels PX. The method of manufacturing the display panel 2 is thereby ended.

According to the display device 1 and the method of manufacturing the display device 1 of the embodiment configured as described above, the pixel PX comprises a single mounting electrode SE. For this reason, the embodiment can contribute to higher definition of the pixel PX as compared with the case where each sub-pixel SP comprises a single mounting electrode SE. The light emitting element 10 of the emission failure may be removed from the display panel 2, but may be left on the pixel electrode PE. Thus, labor of removing the light emitting element 10 of the emission failure from the display panel 2 can be saved.

From the above, the display device 1 and the method of manufacturing the display device 1 that allow repairing to be facilitated can be obtained.

Modified Example 1 of Embodiment

Next, modified example 1 of the embodiment will be described. FIG. 11 is a cross-sectional view showing a part of the display device 1 according to modified example 1 of the above embodiment.

As shown in FIG. 11, the wiring layer WL may be located between the mounting electrode SE of the second pixel PX2 and the additional light emitting element 11a. The additional light emitting element 11a is mounted on the wiring layer WL.

The position of the surface of the side on which the additional light emitting element 11a is mounted can be increased as compared with the case where the wiring layer WL is not located between the mounting electrode SE of the second pixel PX2 and the additional light emitting element 11a. The distance from the insulating substrate 20 to an upper surface of the wiring layer WL is longer than the distance from the insulating substrate 20 to an upper surface of the pixel electrode PEa.

The method of manufacturing the display device 1 according to modified example 1 differs from the manufacturing method of the above-described embodiment in that the wiring layer WL is formed before the additional light emitting element 11 is mounted. When forming the wiring layer WL, the wiring layer WL is also formed on the mounting electrode SE of the second pixel PX2. The additional light emitting element 11a can be thereby mounted further easily. After forming the wiring layer WL, the additional light emitting element 11a is mounted on the wiring layer WL. The wiring layer WL is set to be located between the mounting electrode SE of the second pixel PX2 and the additional light emitting element 11a.

In the display device 1 and the manufacturing method of the display device 1 according to modified example 1 configured as described above, too, the same advantages as those of the above-described embodiment can be obtained.

Modified Example 2 of Embodiment

Next, modified example 2 of the embodiment will be described. FIG. 12 is a plan view showing the first pixel PX1 and the second pixel PX2 of the display device 1 according to modified example 2 of the above-described embodiment, and a view showing the pixel electrodes PE, the mounting electrodes SE, the light emitting elements 10, the additional light emitting element 11a, and the wiring layer WL.

As shown in FIG. 12, the pixel electrodes PEa, PEb, and PEc (light emitting elements 10a, 10b, and 10c) of the respective pixels PX may be arranged in the first direction X, extend in the second direction Y, and be arranged to have a stripe shape (vertical stripe shape). In each pixel PX, the mounting electrode SE is adjacent to the group of pixel electrodes PEa, PEb, and PEc in the second direction Y and extends in the first direction X. The mounting electrode SE is opposed to at least one of the pixel electrodes PEa, PEb, and PEc in the second direction Y.

Incidentally, the positional relationship between the pixel electrodes PEa, PEb, and PEc and the mounting electrode SE is not limited to the positional relationship of modified example 2, but can be variously modified. The above positional relationship is not particularly limited as long as any one pixel electrode PE of the pixel electrodes PEa, PEb, and PEc and the mounting electrode SE can be connected in the wiring layer WL.

In the display device 1 and the manufacturing method of the display device 1 according to modified example 2 configured as described above, too, the same advantages as those of the above-described embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display panel comprising:
   a substrate;
   a first insulating layer provided on the substrate; and
   a plurality of pixels provided on the substrate, located in a display area, and including sub-pixels of a plurality of colors, respectively;
   each of the sub-pixels including:
      a drive transistor covered with the first insulating layer;
      a pixel electrode arranged on the first insulating layer, electrically connected to the drive transistor, and supplied with a signal having a current value controlled from the drive transistor; and a light emitting element mounted on the pixel electrode and including a first electrode electrically connected to the pixel electrode;

each of the pixels including a mounting electrode arranged on the first insulating layer and located to be spaced apart from the pixel electrode, the mounting electrode being in an electrically floating state in a first pixel of the plurality of pixels, a second pixel of the plurality of pixels further includes an additional light emitting element of a first color mounted on the mounting electrode and including a first electrode electrically connected to the mounting electrode, in the second pixel, the mounting electrode is electrically connected to the drive transistor of the sub-pixel of the first color and is supplied with a signal having the current value controlled from the drive transistor, and when the signal having the current value controlled is supplied from the drive transistor of the sub-pixel of the first color to the pixel electrode of the sub-pixel of the first color and the mounting electrode, the light emitting element of the first color of the sub-pixel of the first color does not emit light, but the additional light emitting element of the first color emits light, and the second pixel further includes a wiring layer located on the first insulating layer to connect the pixel electrode of the sub-pixel of the first color with the mounting electrode.

2. The display panel of claim 1, wherein the wiring layer is a metallized layer.

3. The display panel of claim 2, wherein the wiring layer is located between the additional light emitting element and the mounting electrode of the second pixel and, and the additional light emitting element is mounted on the wiring layer.

4. The display panel of claim 1, wherein the wiring layer is located between the additional light emitting element and the mounting electrode of the second pixel and, and the additional light emitting element is mounted on the wiring layer.

5. The display panel of claim 1, further comprising:

a second insulating layer located on the pixel electrodes, the mounting electrodes, and the wiring layer, covering the pixel electrodes, the mounting electrodes, and the wiring layer, and exposing the light emitting elements and the additional light emitting element.

6. The display panel of claim 5, further comprising:

a common electrode arranged on the second insulating layer, the light emitting elements, and the additional light emitting element, and shared by the sub-pixels, wherein each of the light emitting elements and the additional light emitting element includes a second electrode electrically connected to the common electrode.

7. The display panel of claim 6, wherein in the second pixel, a current does not flow between the pixel electrode of the sub-pixel of the first color and the common electrode via the light emitting element of the first color.

8. The display panel of claim 1, wherein each of the light emitting element and the additional light emitting element is a micro-light-emitting diode.

\* \* \* \* \*